United States Patent [19]

Comstock et al.

[11] Patent Number: 4,736,108

[45] Date of Patent: Apr. 5, 1988

[54] APPARATUS AND METHOD FOR TESTING COPLANARITY OF SEMICONDUCTOR COMPONENTS

[75] Inventors: Robert L. Comstock; Michael R. Hansen, both of Santa Clara; Edrick H. Tong, Sunnyvale, all of Calif.

[73] Assignee: Santana Engineering Systems, Santa Clara, Calif.

[21] Appl. No.: 891,443

[22] Filed: Jul. 29, 1986

[51] Int. Cl.[4] .............................................. G01N 21/86
[52] U.S. Cl. .................... 250/561; 250/223 R
[58] Field of Search ................... 250/223 R, 560, 561; 356/383, 376

[56] References Cited

U.S. PATENT DOCUMENTS

| | | | |
|---|---|---|---|
| 4,200,395 | 4/1980 | Smith | 356/356 |
| 4,319,845 | 3/1982 | Shuji | 356/400 |
| 4,422,763 | 12/1983 | Kleinkmecht | 356/356 |
| 4,499,649 | 2/1985 | Maxner | 250/227 |
| 4,529,315 | 7/1985 | Cohen | 356/375 |
| 4,542,989 | 9/1985 | Remijan | 356/373 |
| 4,549,087 | 10/1985 | Duncen et al. | 250/223 R |
| 4,553,843 | 11/1985 | Langley et al. | 250/561 |

FOREIGN PATENT DOCUMENTS 1175998  7/1967  United Kingdom ............... 356/156

Primary Examiner—Davis L. Willis
Assistant Examiner—Chung K. Seo
Attorney, Agent, or Firm—Townsend & Townsend

[57] ABSTRACT

A method and apparatus for measuring the alignment of leads along the perimeter of an integrated circuit surface mount device (SMD). The device is placed so that a first lead is within the path of a beam of light emitted from a light source. The light source is moved around the perimeter of the device so that the beam of light contacts all of the leads of the device. The angle of reflection of the beam of light off of each of the leads is detected. From this angle, the alignment of the leads is determined by first calculating a seating plane and then calculating the variation of each lead from the seating plane.

18 Claims, 4 Drawing Sheets

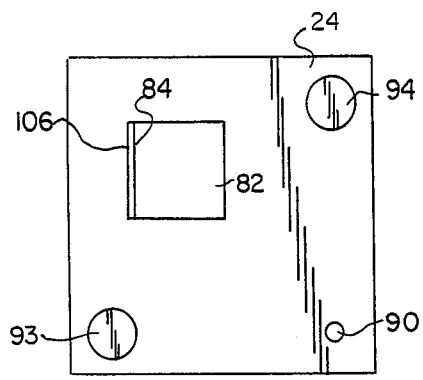
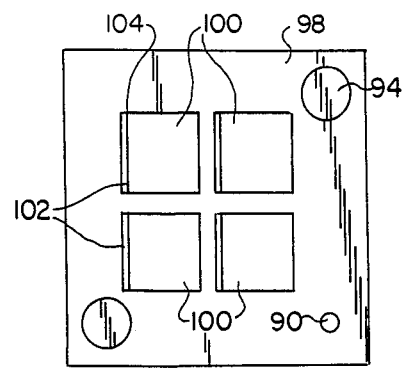
FIG. 3A          FIG. 3B
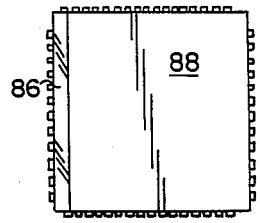
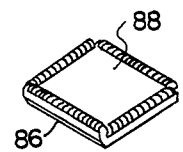
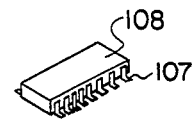
FIG. 4A          FIG. 4B          FIG. 4C
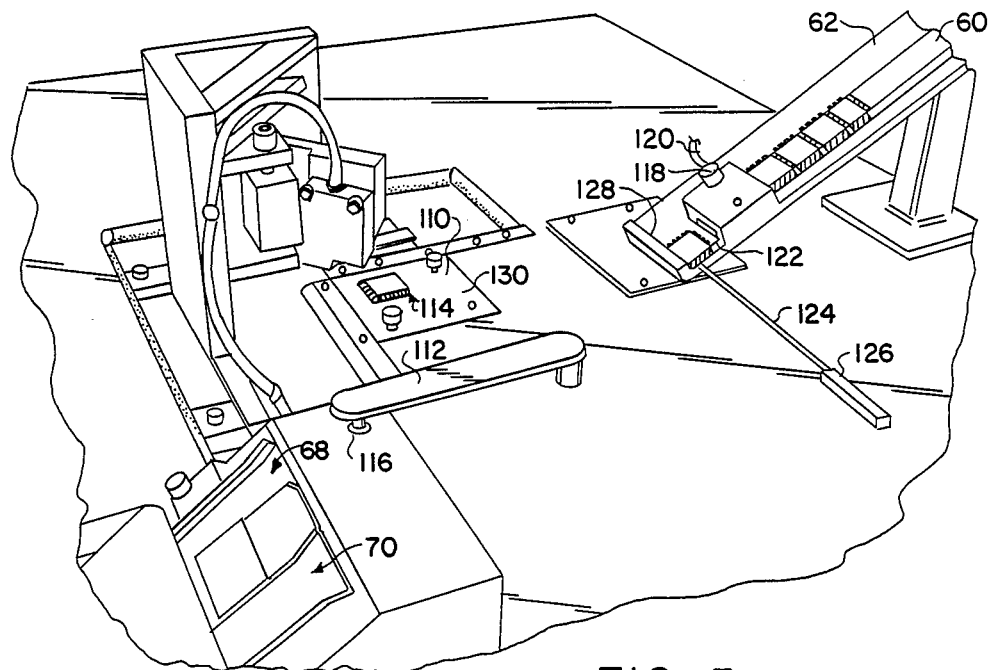
FIG. 5

APPARATUS AND METHOD FOR TESTING COPLANARITY OF SEMICONDUCTOR COMPONENTS

BACKGROUND

The present invention relates to position detection using light, and more particularly to determining the coplanarity of surface-mounted integrated circuits.

A number of methods and apparatus exist for detecting the position and shapes of objects using lasers or other light sources. In one method, light reflected from an object is focused onto a camera or a solid-state image detector having a plurality of elements. Each pixel, or element, in the detector can be monitored to determine the outline of the object being tested. In other applications, such as optical heads for reading optical discs, two or more detectors are used to detect a reflected laser beam off the optical disc. The relative intensities of light hitting the detectors is compared for focusing and tracking information. Yet another type of position detector uses a linear photo-detector which produces an output signal proportional to the position on the detector where a reflected beam of light impacts. Such detectors can be used for monitoring moving objects, such as optical discs, and for maintaining a constant thickness for a material in a manufacturing process.

In the area of integrated circuits, one type of integrated circuit is mounted flat on top of a circuit board, rather than having leads which extend through holes in the board. This type of a device is called a surface-mount device. It is essential that all the leads of such a surface-mount device be within the same plane so that it can be mounted accurately upon a circuit board. There is a need for a tester to determine the coplanarity of surface-mount devices.

SUMMARY OF THE INVENTION

The present invention is a method and apparatus for measuring the alignment of leads along the perimeter of an integrated circuit (IC) package. The package is placed so that a first lead is within the path of a beam of light emitted from a light source. The light source is moved around the perimeter of the package so that the beam of light contacts all of the leads of the package. The beam of light is reflected at an angle off of each of the leads so that the beam's point of impact on a photodetector varies horizontally in proportion to the height of the leads. The alignment of the leads is then determined by first calculating a seating plane (the plane upon which leads of the IC rest) and then calculating the variation of each lead from the seating plane.

Preferably, a light-emitting diode (LED) or laser shines monochromatic light onto the leads, and the light is reflected onto a position sensitive detector. The position sensitive detector is an elongate photo-detector which produces a different level signal depending upon where along the photo-detector the beam of light is incident. The surface-mount integrated circuit package is placed underneath the sensor upside down in a socket in a plate aligned relative to the sensor. The sensor first calibrates itself by moving to determine the position of the leads relative to its home position and the perimeter of the leads. Once the calibration is done for a first package in a batch, the sensor assumes the remaining packages have the same alignment as the first and calibration is not done for subsequent packages, resulting in a faster testing speed.

The data is not analyzed until it is all input into memory by taking the signal from the probe and converting it into digital form. The data is first analyzed to determine the seating plane by finding the three lowest values for the height of the leads on two nonadjacent sides. The triangle formed by these three points, when projected onto the semiconductor package, must contain the centroid of the package. Once the seating plane is determined, the remainder of the data points corresponding to lead heights are compared to the seating plane to determine whether they fall within a permissible range. If a lead is out of tolerance, a failure signal is produced.

The packages can be placed beneath the probe by a number of methods. In a first method, a pair of plates having sockets for holding the IC packages and driven by air cylinders are positioned at right angles and are alternately moved underneath the probe. An operator can remove a previously tested IC package and place a new IC package in the plate for the next test while an IC package in the other plate is being tested. Alternately, a robot arm can pick up integrated circuit packages and place them in the recess of a fixed plate and then remove the package after testing.

For a fuller understanding of the nature and advantages of the invention, reference should be made to the ensuing detailed description taken in conjunction with the accompanying drawings.

BRIEF DESCRIPTION OF THE DRAWINGS

FIGS. 3A and 3B are top plan views of two types of plates utilized in the embodiment of FIG. 1;

FIG. 4A is a bottom plan view of a first type of surface-mount device which can be tested in the tester of FIG. 1;

FIG. 4B is a perspective view of the surface-mount device of FIG. 4A;

FIG. 4C is a perspective view of a second type of surface-mount device;

FIG. 5 is a perspective view of an alternate embodiment of a coplanarity tester which utilizes a robot arm for the placement of integrated circuit packages;

DETAILED DESCRIPTION OF THE PREFERRED EMBODIMENTS

Figure 1:
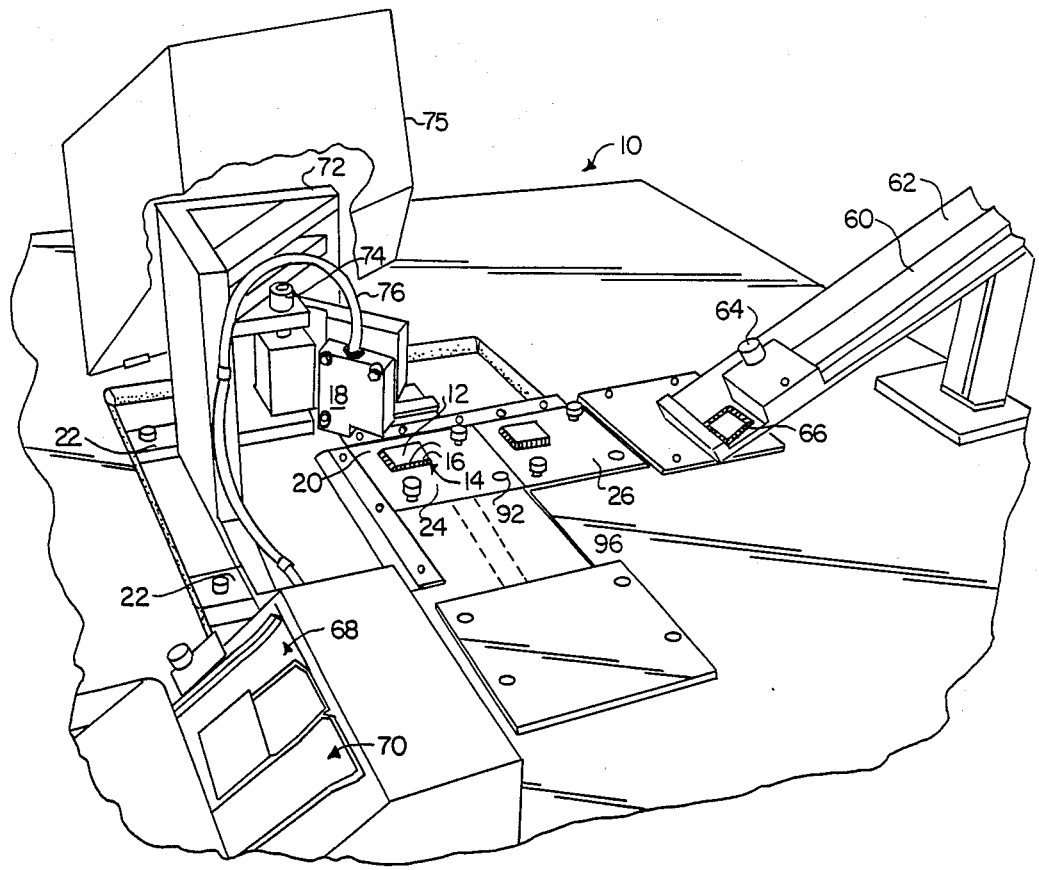
FIG. 1 is a perspective view of a coplanarity tester according to the present invention using a pair of movable plates to hold the IC package.

FIG. 1 is a perspective view of a coplanarity tester 10 according to the present invention. A surface-mount IC package 12 is mounted upside down in a socket 14 in a plate 24 so that its leads 16 are pointing upwards. A probe 18 reflects a beam of light 20 off of the leads 16. Probe 18 is mounted on a dual-axis table 22 which moves the probe around the perimeter of package 12.

The IC packages are placed beneath probe 18 using a pair of plates 24, 26. The plates are alternately moved into position as shown in the broken away view of FIG.

2. Plate 26 is coupled via a member 28 to a rod 30 which is driven by an air cylinder 32. Air cylinder 32 is driven by a pneumatic tube 34 which is controlled by a relay (not shown). A pair of magnetic sensors 36, 38 monitor the position of rod 30 and provide a feedback signal to a controller (not shown). Similarly, plate 24 is coupled to a member 40 which is coupled via lever arms 42 and 44 to a rod 46 which is driven by an air cylinder 50 with a pair of detectors 52, 54 and a driving pneumatic tube 56.

Precise alignment is achieved using precision machined plates 24 and 26 made of hardened steel which are in a guideway 58 also made of hardened steel. In operation, an IC package is placed within the socket of plate 26, which is in the position shown in FIG. 1. Plate 24 is then removed completely from beneath probe 18. The arrival of plate 24 at the removed position is detected by switch 52 which is triggered by a magnet in rod 46. Plate 26 is then advanced until it is beneath probe 18 at a position detected by switch 36. Plate 26 is driven up against the edges of guideway 58. Plate 24 is then driven against the edge of plate 26 to firmly hold it in place. After the IC package on plate 26 is tested, plate 24 is backed off, allowing plate 26 to be drawn back and the process is repeated with plate 24. The IC package in the socket of plate 26 is removed and the next IC package to be tested is placed in the socket of plate 26.

A tube 60 containing the IC packages to be tested is mounted on a platform 62 and held in place with a screw 64. The next IC package 66 to be tested will fall from the bottom of the tube where it can be picked up by an operator and placed in the appropriate socket. After testing, an IC package can be placed in one of guideways 68, 70 for ICs which passed the coplanarity test and those that don't, respectively. Tubes can be placed within guideways 68, 70 to receive the tested ICs, with the angle of guideways 68, 70 being adjustable so that the ICs will slide into the tubes under the force of gravity, with a larger angle being used for lighter ICs. Too high of an angle will result in the ICs bumping each other with possible damage to the alignment of the leads.

Probe 18 is mounted on dual-axis table 22 using a mount 72. The height of probe 18 can be adjusted using an adjustment screw 74. The signal from probe 18 is passed along a wire 76 to a controller (not shown). Dual-axis table 22 is driven by a pair of motors not shown in this figure. A shroud 75 covers probe 18 to keep out most ambient light and prevent pinched fingers from moving dual-axis table 22, and is hinged to allow movement for adjustment of probe 18.

Figure 2:
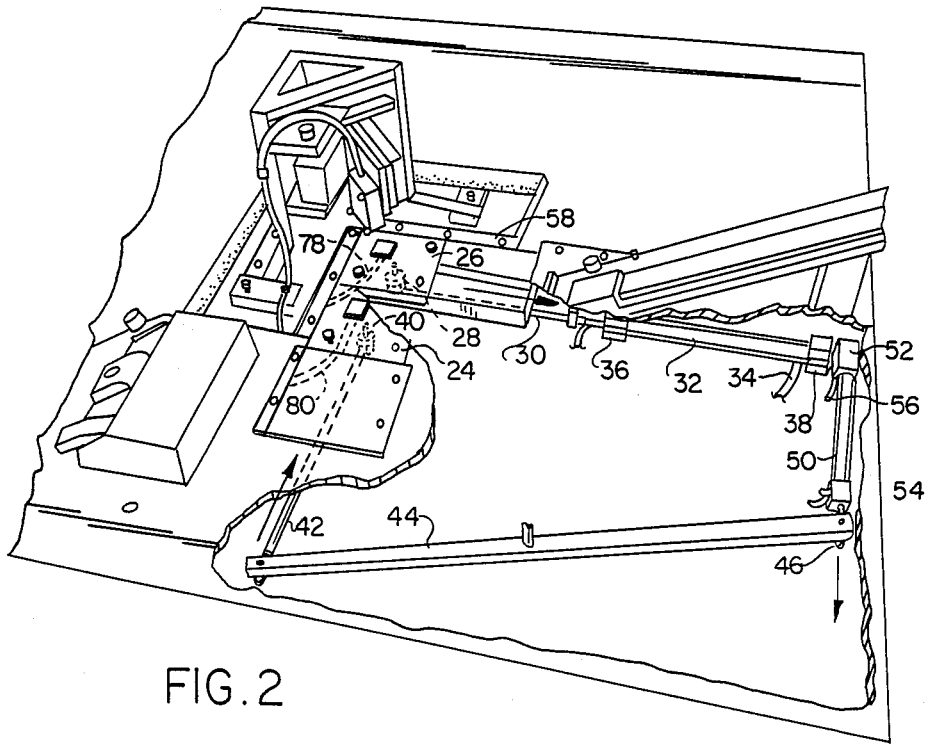
FIG. 2 is a perspective view, partially broken away, of the embodiment of FIG. 1.

Referring again to FIG. 2, the IC packages to be tested are held in their respective sockets by a vacuum from a pair of tubes 78, 80 shown in phantom. This vacuum prevents the IC packages from being jarred out of their sockets during movement of the plates.

FIGS. 3A and 3B show two different embodiments of the plate for use in the coplanarity tester 10 of FIG. 1. In FIG. 3A, a single socket 82 is provided with a beveled edge 84. Beveled edge 84 compliments the beveled edge 86 on a first side of an IC package 88 as shown in FIG. 4A. The other three sides of IC package 88 are straight. Plate 24 of FIG. 3A contains a hole 90 for receiving pin 92 as shown in FIG. 1. A pair of screws 93, 94 are provided to mount the plate on the moving base 96 of FIG. 1.

Alternately, a plate 98 as shown in FIG. 3B having four sockets 100 can be used. Each socket 100 has a beveled edge 102 for receiving an IC package. A corner 104 of a first socket 100 is aligned in the same position as a corner 106 in plate 24 of FIG. 3A. This allows probe 18 of FIG. 1 to use the same home position regardless of the size of the IC being tested. Different plates can be used for different size IC packages with the sockets sized and arranged accordingly.

An alternate shape of a surface-mount integrated circuit is shown in FIG. 4B which has bent legs 107 and a rectangular shaped body 108.

FIG. 5 shows an alternate embodiment in which a plate 110 is not movable and a robot arm 112 is used to place the integrated circuit packages in socket 114 of plate 110. Arm 112 has a suction device 116 for grasping integrated circuit packages from support 62 and placing the IC package in socket 114. After testing, arm 112 can take an IC from socket 114 and place it within one of guideways 68, 70.

After tube 60 is placed on support 62, a clamping device 118 controlled by a pneumatic tube 120 will hold the first IC package down until it is commanded to release it. Upon release, the IC package will fall to a position 122 where it is detected by a beam 124 from an electric eye 126. The IC package will be resting against a rubber surface 128 so that it is not damaged. When electric eye 126 signals that the IC package is ready, robot arm 112 will move over to pick up the IC package and place it in socket 114. When different sized IC packages are to be tested, a new plate can be inserted in place of plate 130.

Figure 6:
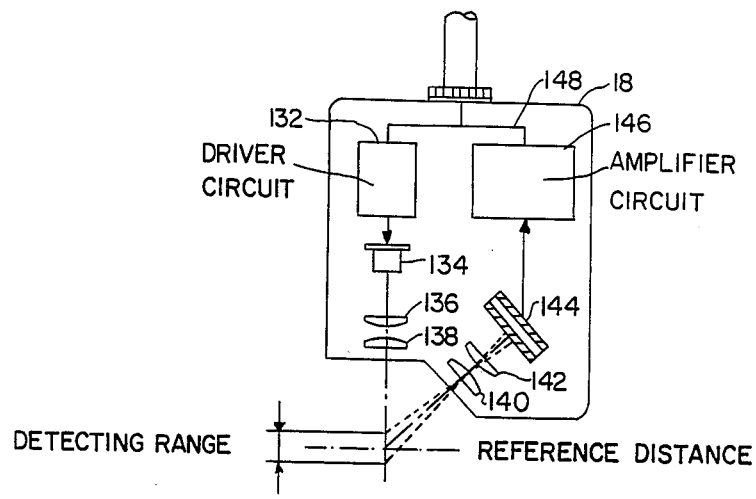
FIG. 6 is a schematic diagram of the position sensor used in the embodiment of FIG. 1.

Probe 18 is shown in more detail in FIG. 6. The probe has a driver circuit 132 which is coupled to an LED 134. Light from LED 134 passes through a pair of lenses 136, 138 where it is focused onto the object surface. Reflected light is passed through a pair of lenses 140, 142 and impinges upon a position sensor 144. Position sensor 144 is an elongate photo-detector which produces an electrical signal proportional to the position of the reflected beam upon the surface of position sensor 144. The signal from sensor 144 is passed through an amplifier circuit 146 to an output line 148.

Figure 7:
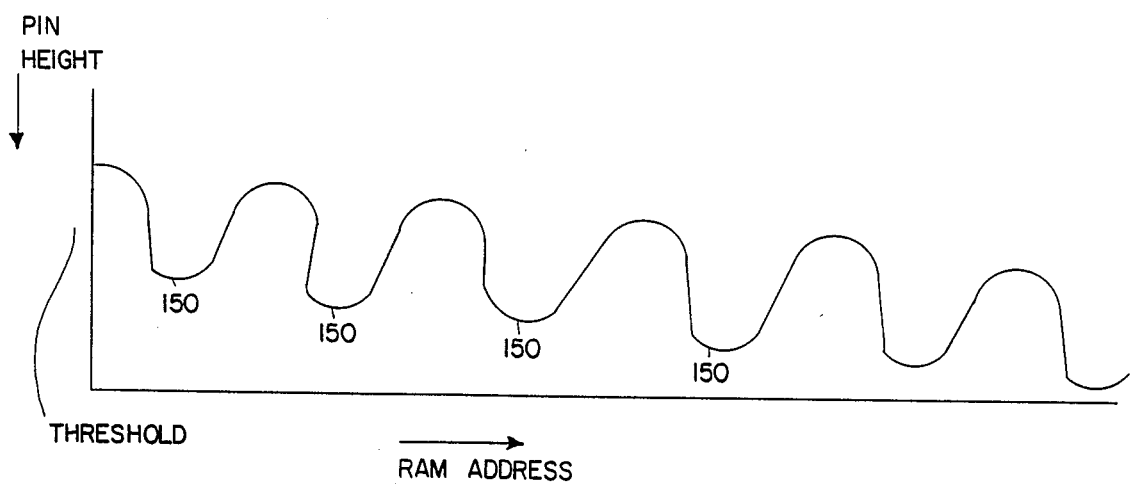
FIG. 7 is a diagram of the electrical output of the sensor of FIG. 6.

The output signal from sensor 18 is shown in FIG. 7 as sensor 18 is moved across a number of leads of an integrated circuit package. The minimum values at a plurality of local minima 150 correspond to the height of the leads of the integrated circuit package. The sloping nature of a line through the respective minima 150 indicates that the IC package has a top surface which is not completely flat, thus resulting in the plane of the leads being at an angle with respect to the coplanarity tester 10 of FIG. 1. Because the top surface of the IC package will be facing up when the IC package is mounted on a circuit board, precision is not required in manufacturing the IC package. The only precision required is that the leads themselves form a single plane so that the IC package will seat properly upon a circuit board. However, since the IC package is placed upside down in the coplanarity tester, provision is made for this sloping signal, as discussed below.

Figure 8:
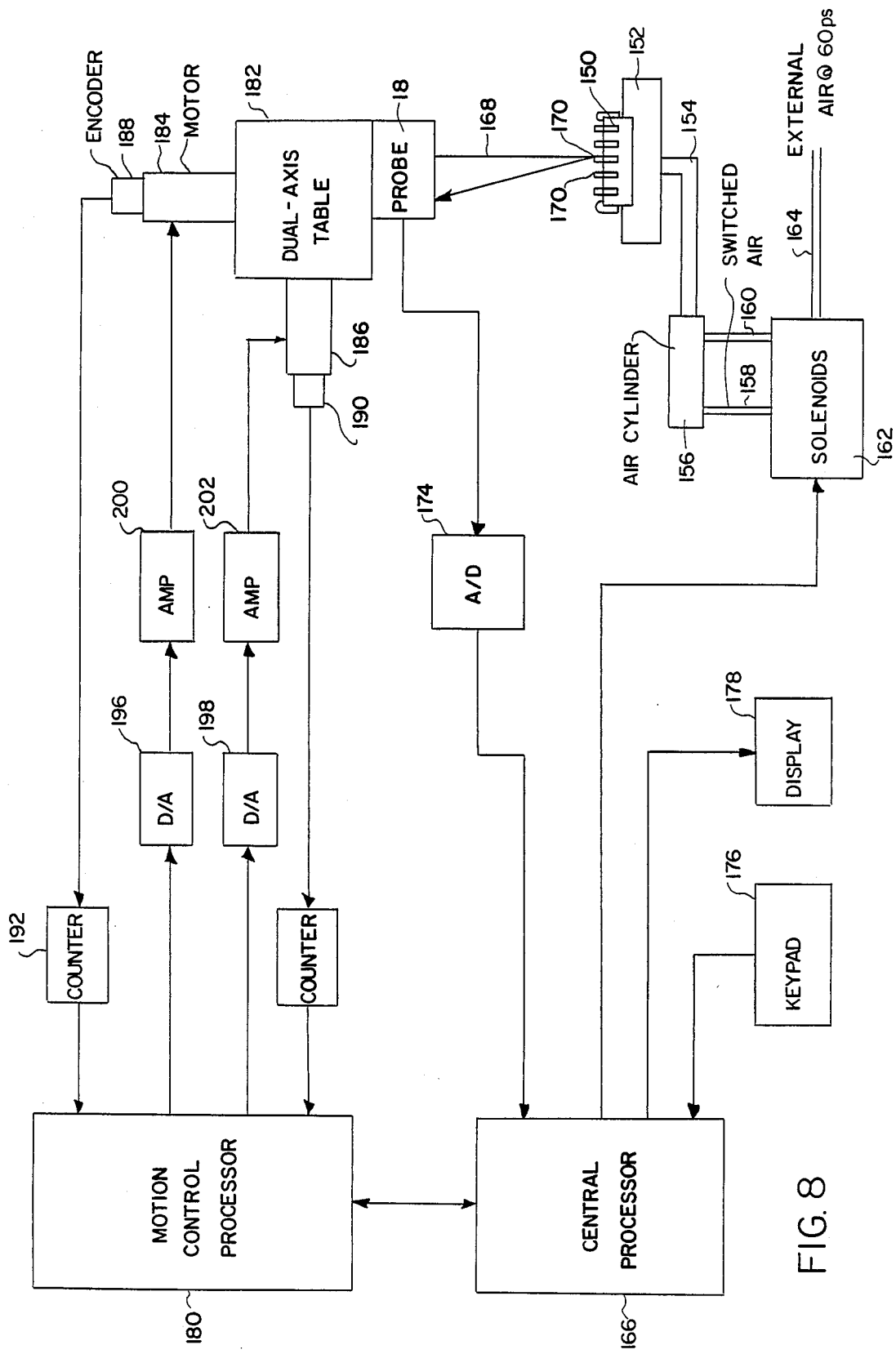
FIG. 8 is a block diagram of the electrical control system for the embodiment of FIG. 1.

FIG. 8 shows a schematic diagram of the electronic control circuit for the coplanarity tester. An IC package 150 is shown mounted on a plate 152 which is coupled to a rod 154 in a air cylinder 156. Air cylinder 156 is driven by a pair of pneumatic tubes 158, 160 which are controlled by solenoids 162. Solenoids 162 also receive external air at 60 psi through a tube 164. Solenoids 162 are controlled by a central processor 166.

A light beam 168 is reflected off of leads 170 of IC package 150 by probe 18. The output of probe 18 is passed through an analog-to-digital converter 174 to central processor 166, which analyzes the data. A keypad 176 and a display 178 are coupled to central processor 166 to provide information input and output.

Central processor 166 is coupled to a motion control processor 180 which controls the motion of dual-axis table 182. Dual access table 182 is driven by a pair of motors 184 and 186, each of which has a 1,000 pulse encoder 188, 190, respectively, coupled to it for controlling its position. The output of encoders 188 and 190 are fed through counters 192 and 194, respectively, to motion control processor 180. Motors 184 and 186 are driven by motion control processor 180 through signals provided to digital-to-analog converters 196, 198, respectively, which are amplified by amplifiers 200, 202, respectively. Encoders 188, 190 are available from Hewlett-Packard and encoders 184, 186 are available from Pittman Motors.

In operation, once a part is in the measurement area, central processor 166 commands sensor 18 in a path that follows the peaks of the test part's leads. It achieves this by controlling dual-axis closed-loop servo table 182 to which sensor 18 is mounted. Processor 166 digitizes and stores sensor output during this path traversal. The sample rate is fixed at 1000 Hz with a table speed of 2.0 in/sec. Data thus taken is not analyzed until the part has been fully circled and data collection is complete. The raw sensor data from each side has the appearance shown in FIG. 7. The data is digitized by A/D converter 174 and fed to processor 166.

To determine the true individual pin heights from such a data base, processor 166 searches for local minima (sensor output is directly related to the sensor-to-lead displacement and thus grows smaller as pin height increases). Regions of local minima are distinguished by sensor outputs that are more negative than a set threshold level. The local minima themselves are the most negative values within these regions.

All measurements are relative to the plane of the x-y servo table 182 positioning the sensor. Due to the construction of the machine's frame, the sliding of socket plates, and, most importantly, the anomalies of the package body, the plane of the package's leads and the plane of the sensor motion are rarely parallel.

This causes the slope of the pin values to be non-level, as shown in FIG. 7. To perform the algorithm for finding the seating plane it is necessary to have a set of 3-dimensional points that are evenly distributed above and below a reference plane. This reference plane is the plane of best fit and it is derived from the least-mean-squares method of linear algebra.

One knows the (x,y) coordinate of each pin from the geometry of the package. The package type is input to processor 166 via keypad 176 before the probe is activated. The z coordinate is that derived from the data filtering algorithm described above (searching for local minima). Standard linear algebra is used to determine the best fit plane from any given set of 3-space points.

Once one has the best fit plane for the leads, the task of determining the seating plane is reduced to the following algorithm.

The three most negative points that are distributed as follows are picked:
 (a) they are on at least two distinct, nonadjacent sides;
 (b) the triangle formed by the projection of these three points onto the x-y plane contains the centroid of the package body (otherwise the center of gravity of the part would pull it over and you could not have the seating plane); and
 (c) the plane formed by these three points has all other points above it.

In order to improve speed, no probe-processor feedback is used while the probe circles the integrated circuit package. Instead, the probe is first calibrated to determine the probe path during a measurement. This calibration is done on a first IC package from a single batch of IC packages. The probe is moved to the anticipated position of a first lead and is moved around until a local minimum is discovered. The x,y offset of this position from the referenced location of the probe is recorded. The probe then moves along the contour of the package to detect each local minimum. As each minimum is detected, the probe moves around to determine that a more minimum value is not present nearby. As a result of this calibration, processor 166 obtains the x and y distances from one side to the other of the leads on the IC package.

A single calibration for a batch of parts is sufficient because all parts in a batch are formed by the same die. For proper detection of the leads, the probe's light beam is preferably much smaller than the contact surface of the lead, preferably by 1:3 margin. The small light beam is needed because the top of the lead is curved, and the smaller the spot the greater the distance from the edge of the spot to the point where the lead curves down. Typically, a lead will have a distance of 20 mil. before it curves down greater than 0.5 mil. Thus, a preferred spot size for the light beam is 6-10 mil.

The positional accuracy of dual-axis table 182 is greater than 0.15 mil. With this accuracy and the small light beam, errors in height measurement of the leads will be insignificant. Errors caused by the leads being bent laterally do not become significant until the lead is sufficiently bent so that it is deflected by more than 10 mil. from its proper horizontal position. Such a degree of bending will put the lead 4 mil. out of the seating plane and will produce an error in the lead peak detection of 0.5 mil. This error is due to the fact that the probe is detecting a portion below the actual lead peak as the lead peak. Although the 0.5 mil. error becomes significant, the lead is out of tolerance in any event and thus the overall result is not affected.

As will be understood by those familiar with the art, the present invention may be embodied in other specific forms without departing from the spirit or essential characteristics thereof. For example, a row of photodetectors could be used rather than a single linear photo-detector. Accordingly, the disclosure of the preferred embodiments of the invention is intended to be illustrative, but not limiting, of the scope of the invention which is set forth in the following claims.

What we claim is:

1. A method for measuring the coplanarity of the contact points of a plurality of leads disposed along the perimeter of an integrated circuit package, comprising:
 positioning a first lead of said plurality of leads of said integrated circuit package to have its contact point disposed within the path of a beam of light emitted from a light source;
 determining the position of a seating plane;
 moving said light source relative to said package around the perimeter of said package so that said beam of light illuminates each of the contact points of said leads of said package;

detecting a position of reflection of said beam of light off of the contact point of each of said leads; and determining whether the detected position of reflection for any of said leads is outside a predetermined tolerance of said seating plane.

2. The method of claim 1 wherein said positioning step comprises placing said integrated circuit package into a socket in a plate, said socket being shaped to conform to the exterior contour of said package.

3. The method of claim 2, further comprising selecting a plate having one or more sockets of a size corresponding to a size of said package.

4. The method of claim 3 further comprising moving said selected plate to a fixed position with respect to said light source.

5. The method of claim 1 wherein said light source is a light-emitting diode.

6. The method of claim 1 further comprising the calibrating steps of:

moving said light source until a contact point of a corner lead of a first integrated circuit package is detected;

determining x and y offsets of said contact point of said corner lead from a home position of said light source by processing said position of reflection of said beam of light while moving said light source over said corner lead; and moving said light source around the perimeter of said package to determine x and y distances of said contact points of said leads.

7. The method of claim 6 further comprising the steps of:

moving said light source around a perimeter defined by said x and y offsets and said x and y distances; and storing signals corresponding to said position of reflection for processing after said perimeter is traversed.

8. The method of claim 1 further comprising the steps of:

producing a signal proportional to said position of reflection of said beam; and determining local minima in said signal, said minima corresponding to said leads.

9. The method of claim 8 wherein said seating plane is determined by first determining a reference plane of best fit to said minima by a least mean squares method and then determining the three minima of said signal having the most negative values below said reference plane, said three minima corresponding to contact points of three leads on more than one side of said package, said sides being nonadjacent, said contact points of said three leads defining a triangle whose projection onto said package contains the centroid of said package, all other contact points of said leads being above a plane formed by said contact points of said three leads.

10. An apparatus for measuring the coplanarity of the contact points of a plurality of leads disposed around the perimeter of an integrated circuit package, comprising:

a probe having an emitter for emitting a beam of monochromoatic light onto the contact portions of the leads of an IC package, and a detector for detecting a position of reflection of said beam from said contact portions and producing an electrical signal proportional to said postion of reflection for each said lead;

means for positioning said integraed circuit package proximate said probe;

means for moving said probe and package relative to each other so that said beam is reflected off said contact portions of said leads; and means for analyzing said electrical signal to determine the coplanarity of said contact portions of said leads.

11. The apparatus of claim 10 wherein said means for moving comprises a dual axis table coupled to said probe and first and second motors for driving said dual axis table.

12. The apparatus of claim 11 further comprising:

a motion control processor;

first and second analog-to-digital converters coupled to said processor;

first and second amplifiers coupled between said first and second analog-to-digital converters, respectively, and said first and second motors, respectively;

first and second encoders coupled to said first and second motors, respectively; and first and second counters having inputs coupled to said first and second encoders, respectively, and outputs coupled to said processor.

13. The apparatus of claim 10 wherein said positioning means comprises a movable plate having a socket shaped to conform to the exterior contour of a top portion of said integrated circuit package.

14. The apparatus of claim 13 further comprising an air cylinder coupled to said plate for moving said plate.

15. The apparatus of claim 10 wherein said positioning means comprises a plate beneath said probe having a socket shaped to conform to the exterior contour of a top portion of said integrated circuit package and a movable arm for picking up said package at a first location and depositing said package in said socket.

16. The apparatus of claim 10 wherein said probe is positioned vertically above said integrated circuit package.

17. The apparatus of claim 10 wherein said means for analyzing comprises an analog-to-digital converter coupled to said probe and a processor coupled to said analog-to-digital converter.

18. The apparatus of claim 17 further comprising a keypad coupled to said processor.

* * * * *